US012596068B2

(12) United States Patent
Saito et al.

(10) Patent No.: US 12,596,068 B2
(45) Date of Patent: Apr. 7, 2026

(54) SENSING SYSTEMS AND REFLECTIVE OPTICAL ELEMENT

(71) Applicant: KABUSHIKI KAISHA TOSHIBA, Tokyo (JP)

(72) Inventors: Shinji Saito, Yokohama Kanagawa (JP); Masatoshi Hirono, Yokohama Kanagawa (JP); Kei Kaneko, Yokohama Kanagawa (JP); Tsutomu Kakuno, Fujisawa Kanagawa (JP); Rei Hashimoto, Edogawa Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 181 days.

(21) Appl. No.: 18/539,113

(22) Filed: Dec. 13, 2023

(65) Prior Publication Data

US 2024/0264076 A1      Aug. 8, 2024

(30) Foreign Application Priority Data

Feb. 8, 2023      (JP) ................................. 2023-017645

(51) Int. Cl.
 *G01N 21/3504*      (2014.01)
 *G02B 1/00*      (2006.01)
  (Continued)

(52) U.S. Cl.
 CPC ......... *G01N 21/3504* (2013.01); *G02B 1/005* (2013.01); *G02B 17/002* (2013.01);
  (Continued)

(58) Field of Classification Search
 CPC .. G01N 21/3504; G02B 1/005; G02B 17/002; G02B 5/045; H01S 5/005; H01S 5/3402
 See application file for complete search history.

(56) References Cited

U.S. PATENT DOCUMENTS 3,289,423 A * 12/1966 Berner ................. F17C 13/086
                                              220/62.19
2007/0109641 A1    5/2007 Mimura
        (Continued)

FOREIGN PATENT DOCUMENTS

IT          1062070 B  *  6/1983  ........... G01N 21/534
JP      2006-243618          9/2006
        (Continued)

OTHER PUBLICATIONS

Schwarz et al., "Watt-Level Continuous-Wave Emission from a Bifunctional Quantum Cascade Laser/Detector," ACS Photonics, pp. 1225-1231. (Year: 2017).*

*Primary Examiner* — Kiho Kim
(74) *Attorney, Agent, or Firm* — Knobbe, Martens, Olson & Bear, LLP

(57)      ABSTRACT

According to one embodiment, a sensing system includes a reflective optical element, and an optical device. The reflective optical element includes a plurality of optical structures arranged along a first plane. The optical device includes an element face. The optical device is configured to perform a first operation and a second operation. The optical device is configured to emit infrared rays from the element face in the first operation. The optical device is configured to detect the infrared rays reflected by the reflective optical element and incident on the element face in the second operation.

19 Claims, 9 Drawing Sheets

1

(51) Int. Cl.

| | |
|---|---|
| *G02B 17/00* | (2006.01) |
| *H01S 5/00* | (2006.01) |
| *H01S 5/34* | (2006.01) |
| *G02B 5/04* | (2006.01) |

(52) U.S. Cl.

CPC ............ *H01S 5/005* (2013.01); *H01S 5/3402* (2013.01); *G02B 5/045* (2013.01)

(56) References Cited

U.S. PATENT DOCUMENTS

| 2008/0238571 A1 | 10/2008 | Kurosaka |
| 2009/0103852 A1 | 4/2009 | Hamamato |
| 2018/0000386 A1 | 1/2018 | Yamakawa |
| 2018/0172580 A1 | 6/2018 | Bjoroy |
| 2019/0148915 A1 | 5/2019 | Saito et al. |
| 2022/0057319 A1 | 2/2022 | Saito et al. |
| 2022/0071521 A1 | 3/2022 | Matsuura et al. |
| 2023/0053065 A1 | 2/2023 | Tsuda et al. |

FOREIGN PATENT DOCUMENTS

| JP | 4772102 | 9/2011 | |
| JP | 4928249 | 5/2012 | |
| JP | 5331088 | 10/2013 | |
| JP | 5444711 | 3/2014 | |
| JP | 6415606 | 10/2018 | |
| JP | 2019-197933 | 11/2019 | |
| JP | 6781248 | 11/2020 | |
| JP | 6786027 | 11/2020 | |
| JP | 6818672 | 1/2021 | |
| JP | 2022-034791 | 3/2022 | |
| WO | WO-9209877 A2 * | 6/1992 | ......... G01N 21/3518 |
| WO | WO 2020/158348 | 8/2020 | |

* cited by examiner

SENSING SYSTEMS AND REFLECTIVE OPTICAL ELEMENT

CROSS-REFERENCE TO RELATED APPLICATIONS

This application is based upon and claims the benefit of priority from Japanese Patent Application No. 2023-017645, filed on Feb. 8, 2023; the entire contents of which are incorporated herein by reference.

FIELD

Embodiments of the invention generally relate to a sensing system and a reflective optical element.

BACKGROUND

A gas monitoring device is known that uses a light source, a detector, a device including first optical means, and second optical means to monitor a target gas between the device and the second optical means.

DETAILED DESCRIPTION

Figure 1:
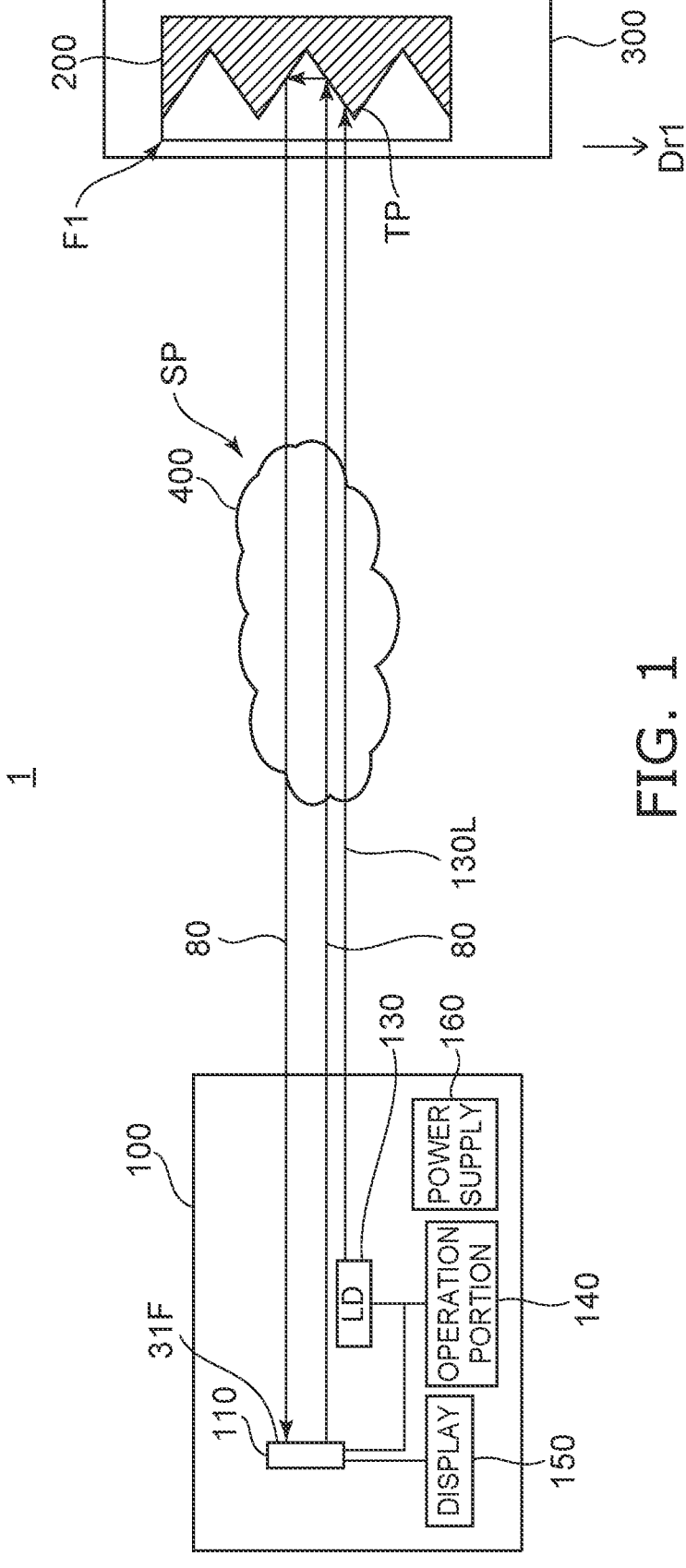
FIG. 1 is a schematic diagram illustrating a sensing system according to an embodiment.

According to one embodiment, a sensing system includes a reflective optical element, and an optical device. The reflective optical element includes a plurality of optical structures arranged along a first plane. The optical device includes an element face. The optical device is configured to perform a first operation and a second operation. The optical device is configured to emit infrared rays from the element face in the first operation. The optical device is configured to detect the infrared rays reflected by the reflective optical element and incident on the element face in the second operation.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic diagram illustrating a sensing system according to an embodiment.

As shown in FIG. 1, a sensing system 1 includes an optical device 110 and a reflective optical element 200.

The reflective optical element 200 includes a plurality of optical structures TP. The plurality of optical structures TP are arranged along a first plane F1. The optical device 110 includes an element face 31F (see FIGS. 3 and 5). The optical device 110 is configured to perform a first operation and a second operation. As shown in FIG. 1, in the first operation, the optical device 110 emits infrared rays 80 from the element face 31F (see FIGS. 3 and 5). As shown in FIG. 1, in the second operation, the optical device 110 detects infrared rays 80 reflected by the reflective optical element 200 and incident on the element face 31F. The element face 31F is, for example, an emitting face. The element face 31F is, for example, an incident face.

The optical device 110 functions as a light source and a photodetector. The optical device 110 may be, for example, a planar quantum cascade device.

The optical device 110 may be included in a detection device 100, for example. The detection device 100 may include the optical device 110, an aiming laser diode 130 (LD), an operation portion 140, a display 150, and a power supply 160. The reflective optical element 200 may be included in a reflector 300.

The sensing system 1 detects a detection target 400 (e.g., gas) that is present between the detection device 100 and the reflector 300, for example. The detection target 400 is, for example, methane ($CH_4$). The infrared rays are absorbed by the detection target 400. The intensity of the detected infrared rays change depending on the presence or absence of the detection target 400 or the degree of absorption based on the concentration.

Thus, the detection target 400 exists in a space SP between the optical device 110 and the reflective optical element 200. In a first state, the infrared rays 80 reflected by the reflective optical element 200 and incident on the element face 31F have a first intensity. In a second state, the infrared rays 80 reflected by the reflective optical element 200 and incident on the element face 31F have a second intensity. A first concentration of the detection target 400 in the first state is higher than a second concentration of the detection target 400 in the second state. In this case, the first intensity is lower than the second intensity. By detecting the intensity of the infrared rays 80, the detection target 400 can be detected.

In one example, the detection target 400 includes, for example, hydrocarbons. For example, the detection target 400 includes methane.

In one example, the optical device 110 (e.g., a planar quantum cascade device) functions as a light source that includes a light source element that emits infrared rays. The optical device 110 functions as a photodetector including a detection element that detects infrared rays. The wavelength of the infrared rays may be, for example, not less than 0.8 μm and not more than 20.0 μm.

Figure 2:
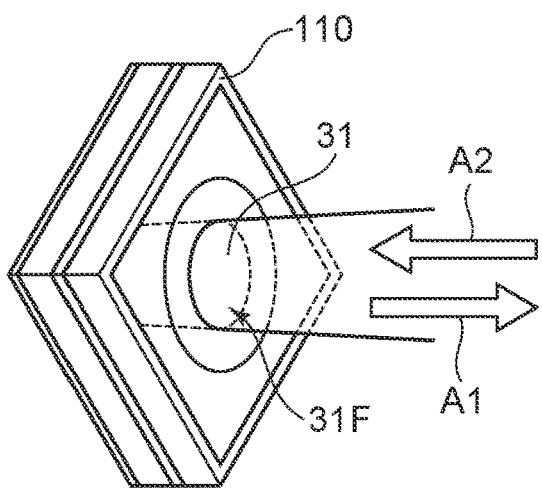
FIG. 2 is a schematic perspective view illustrating a part of the sensing system according to the embodiment.

FIG. 2 is a schematic perspective view illustrating a part of the sensing system according to the embodiment.

FIG. 2 shows one example of the optical device 110 (planar quantum cascade element).

The optical device 110 (planar quantum cascade element) includes, for example, a photonic crystal layer 31. When the optical device 110 functions as a light source, the photonic crystal layer 31 becomes a light exit face. The infrared rays emitted from the optical device 110 have a component in the emission direction A1 perpendicular to the emitting face. When the optical device 110 (planar quantum cascade element) functions as a photodetector, the light incident on the optical device 110 has a component in the incident direction A2 perpendicular to the light emitting face. The incident light includes infrared rays. In the embodiment, a voltage supplied from the power supply 160 to the optical device 110 is controlled.

The voltage supplied to the optical device 110 is a first voltage or a second voltage. The first voltage is higher than the second voltage. The first voltage is an ON voltage. The second voltage is an OFF voltage or a voltage lower than the ON voltage. By controlling the voltage, the light source or photodetector in the optical device 110 (planar quantum cascade element) is selectively used.

For example, infrared rays are emitted from the optical device 110 by a pulse of the first voltage (ON voltage). The infrared rays travel forth and back between the optical device 110 and the reflective optical element 200, and enter the optical device 110. The infrared rays 80 being incident are detected in the optical device 110 to which the second voltage is applied. One element is used as a light emitting device and a light receiving device.

The pulse time period of the first voltage (ON voltage) is shorter than the round travel time period of the infrared rays. The round travel time corresponds to, for example, the time it takes the infrared rays to travel twice the distance between the optical device 110 and the reflective optical element 200. For example, the first time period of the first operation is shorter than the time the infrared rays 80 travel twice the distance between the reflective optical element 200 and the optical device 110. The speed of the infrared rays 80 is approximately 300,000 km/s. The pulse time (first time period) may be, for example, not less than 10 ns and not more than 500 ns.

The second operation is performed after the first operation and continuously with the first operation. A second time period of the second operation may be longer than the first time period. The infrared rays 80 being incident can be detected stably with high accuracy.

The second time period of the second operation corresponds to the time period of the second voltage (such as the OFF voltage). The second time period may be, for example, not less than 50 ns and not more than 100 ns. Such pulses may be set depending on the round travel time (corresponding the distance). In the embodiments, the optical device 110 may be configured to repeatedly perform a set including the first operation and the second operation.

An example of the optical device 110 (for example, a planar quantum cascade device) will be described below.

The aiming LD 130 is a diode that emits a laser beam 130L. The aiming LD 130 is provided, for example, near the optical device 110 (planar quantum cascade element). The aiming LD 130 emits visible light (for example, red). The emission direction of the laser beam 130L of the aiming LD 130 is perpendicular to the emitting face of the optical device 110 (planar quantum cascade element). The emission direction of the laser beam 130L of the aiming LD 130 is parallel to the emission direction A1 of the light (infrared rays) emitted from the optical device 110. The beam from the aiming LD 130 illuminates the target in red. For example, the operator aligns the irradiation position of the laser beam 130L of the aiming LD 130 with the reflective optical element 200. Thereby, it becomes possible to match the infrared ray irradiation destination of the optical device 110 (planar quantum cascade element) to the reflective optical element 200.

The operation portion 140 is used, for example, by an operator to operate the detection device 100. For example, the operator operates the voltage applied by the power supply 160. Depending on the operation, the voltage applied to the optical device 110 (planar quantum cascade element) (first voltage or second voltage) is controlled.

The display 150 displays information to the operator. The display 150 displays, for example, the intensity of the infrared rays 80 detected by the optical device 110 (planar quantum cascade element). The intensity of the detected infrared rays changes depending on the degree of absorption based on the presence or absence or concentration of the detection target 400 (gas). The operator can recognize whether or not the detection target 400 (gas, for example, methane) is generated between the detection device 100 and the reflector 300 based on the detected intensity of infrared rays displayed on the display 150.

The power supply 160 applies power to the optical device 110 (planar quantum cascade element) and the aiming LD 130. Control of the supplied power (voltage) is performed based on the operation of the operation portion 140.

For example, the reflector 300 may be a plate-shaped member. The reflector 300 may be a box-shaped member. The reflective optical element 200 is provided on one face of the reflector 300 or one face inside the reflector 300. The size (length in one direction) of the reflective optical element 200 is 10 mm or less. The size may be 5 mm or less. The size of reflector 300 is small. For example, worker handling is good. The reflective optical element 200 reflects infrared rays emitted from the optical device 110 (planar quantum cascade element).

As shown in FIG. 1, the reflective optical element 200 includes the plurality of optical structures TP. As described later, the size of one of the plurality of optical structures TP is smaller than the size of the optical device 110 (planar quantum cascade element). In FIG. 1, the plurality of optical structures TP are enlarged and displayed for ease of viewing. The reflective optical element 200 is fixed to the reflector 300, for example. For example, the reflective optical element 200 may be fixed to an arbitrary location such as a wall surface. An example of the reflective optical element 200 will be described later.

Examples of the optical device 110 (planar quantum cascade device) will be described below with reference to FIGS. 3 and 4.

Figure 3:
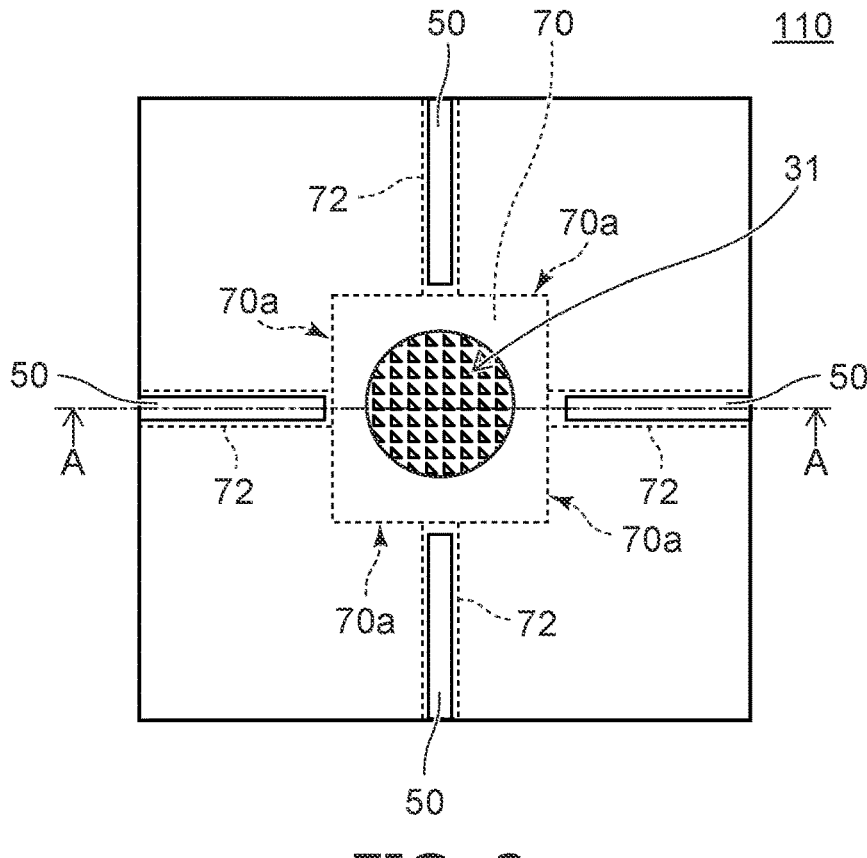
FIG. 3 is a schematic plan view illustrating a part of the sensing system according to the embodiment.

FIG. 3 is a schematic plan view illustrating a part of the sensing system according to the embodiment.

Figure 4:
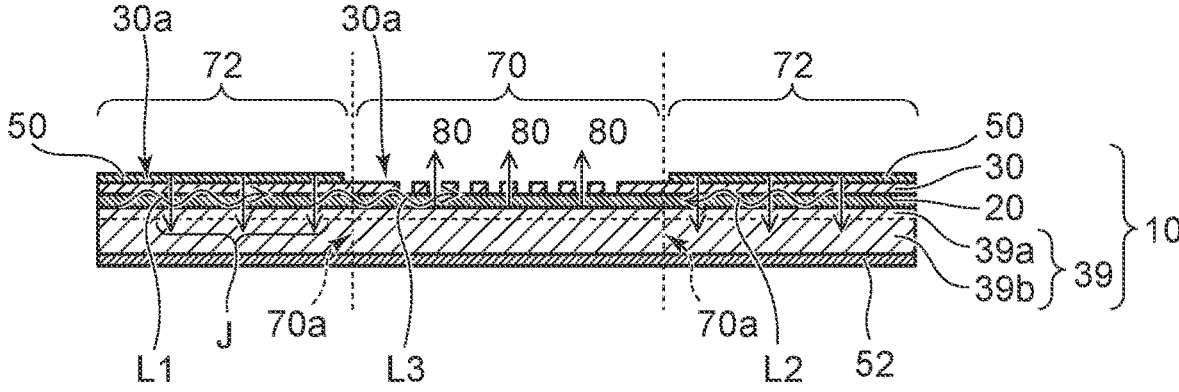
FIG. 4 is a schematic cross-sectional view illustrating a part of the sensing system according to the embodiment.

FIG. 4 is a schematic cross-sectional view illustrating a part of the sensing system according to the embodiment.

FIG. 4 corresponds to the sectional view taken along the line A-A in FIG. 3.

As shown in FIGS. 3 and 4, the optical device 110 (planar quantum cascade element) includes a semiconductor stack 10, a first electrode 50 (for example, an upper electrode), and a second electrode 52 (for example, a lower electrode).

The semiconductor stack 10 includes an active layer 20, a first semiconductor layer 30, and a second semiconductor layer 39. The active layer 20 is provided between the second semiconductor layer 39 and the first semiconductor layer 30. The first semiconductor layer 30 includes the photonic crystal layer 31. The active layer 20 emits infrared rays. The active layer 20 includes multiple quantum well layers. The emitted infrared rays are generated, for example, by inter-subband transitions between quantum well layers.

For example, the first electrode 50 is provided on the upper face of the first semiconductor layer 30. The second electrode 52 is provided on the lower face of the second semiconductor layer 39. At least a part of the second electrode 52 overlaps the first electrode 50. The photonic crystal layer 31 is provided on the upper surface 30a side of the first semiconductor layer 30.

The semiconductor stack 10 includes a surface emitting region 70 and a current injection region 72. The surface emitting region 70 includes photonic crystal layer 31. The current injection region 72 is provided around the surface emitting region 70 in plan view. The current injection region 72 extends radially outward from the outer edge 70a of the surface emitting region 70. For example, a part of the first semiconductor layer 30 (including the photonic crystal layer 31), a part of the active layer 20, and a part of the second semiconductor layer 39 are stacked in the center of the chip. The surface emitting region 70 corresponds to a stacked region. The current injection region 72 corresponds to a region formed by stacking another part of the first semiconductor layer 30, another part of the active layer 20, and another part of the second semiconductor layer 39 on the outer periphery of the chip.

The first electrode 50 is provided in the current injection region 72 of the upper surface 30a of the first semiconductor layer 30. In the example of FIG. 3, the current injection region 72 is provided on the upper surface 30a of the first semiconductor layer 30 along two straight lines that are perpendicular to each other.

Infrared rays 80 (see FIG. 5) are emitted from the active layer 20 included in the current injection region 72 by the current J flowing between the first electrode 50 and the second electrode 52. For example, the current J causes the intersubband transition in the active layer 20, and infrared rays 80 are emitted from the active layer 20. The infrared rays 80 emitted from the active layer 20 are emitted along the direction perpendicular to the surface emitting region 70 while causing optical resonance by the photonic crystal layer 31.

As shown in FIG. 4, lights L1, L2, and L3 generated in the current injection region 72 by the current J flowing between the first electrode 50 and the second electrode 52 travel toward the surface emitting region 70. These lights are affected by the photonic crystal layer 31 in the surface emitting region 70. This action changes the traveling direction of these lights, and these lights are emitted as infrared rays 80 along a direction perpendicular to the surface emitting region 70.

The first electrode 50 may be provided along the first semiconductor layer 30 in any direction in the current injection region 72.

The first semiconductor layer 30 is a first cladding layer (not shown). The first cladding layer may be provided on the active layer 20 side. The second semiconductor layer 39 may include a second cladding layer 39a and a substrate 39b. The second cladding layer 39a is provided between the substrate 39b and the active layer 20.

Figure 5:
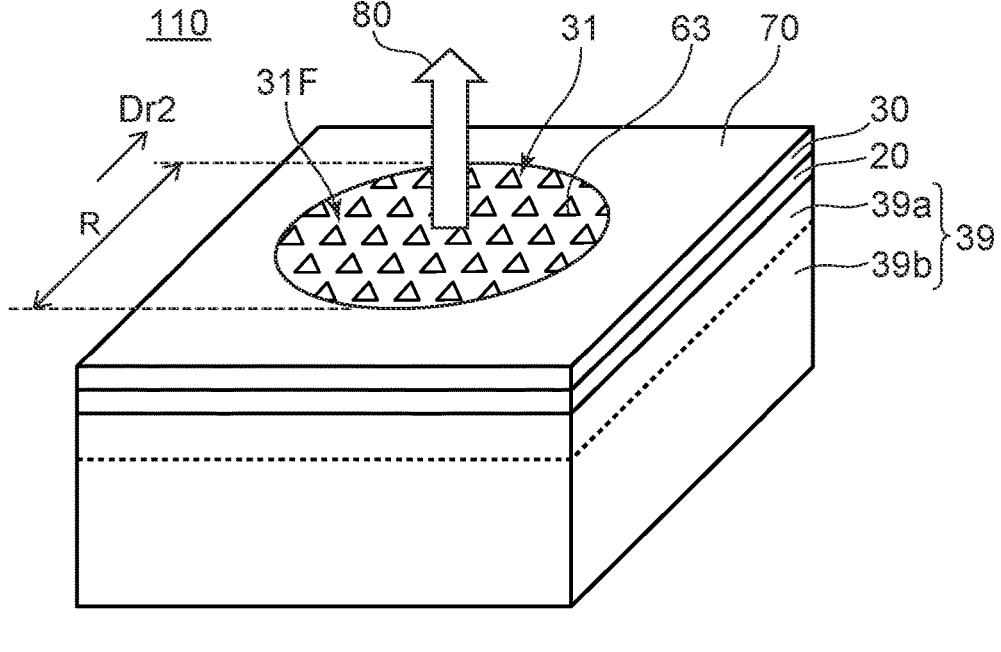
FIG. 5 is a schematic perspective view illustrating a part of the sensing system according to the embodiment.

FIG. 5 is a schematic perspective view illustrating a part of the sensing system according to the embodiment.

Figure 6:
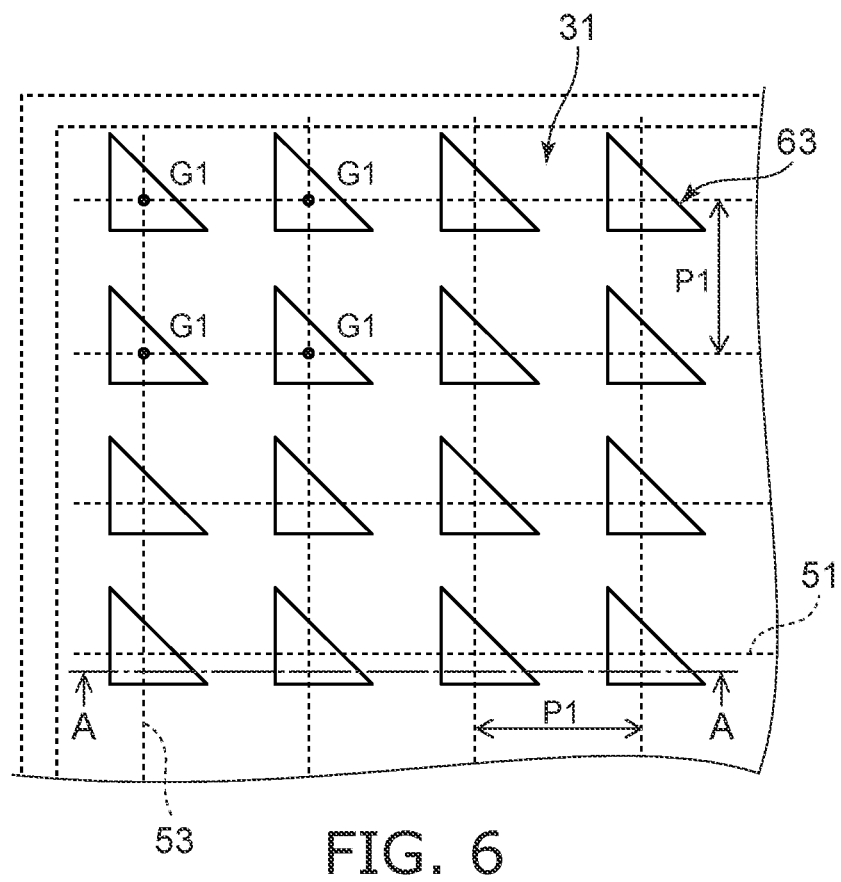
FIG. 6 is a schematic plan view illustrating a part of the sensing system according to the embodiment.

FIG. 6 is a schematic plan view illustrating a part of the sensing system according to the embodiment.

These figures show an example of the optical device 110 (planar quantum cascade element). FIG. 6 shows an example of the photonic crystal layer 31 (two-dimensional lattice) in the optical device 110 (planar quantum cascade element).

As shown in FIG. 5, the photonic crystal layer 31 includes a plurality of structures 63 (for example, pits or protrusions). As shown in FIG. 6, in one example, the plurality of structures 63 are arranged in a two-dimensional rectangular lattice shape. One axis of the two-dimensional rectangular lattice is along a first line 51. Another axis of the two-dimensional rectangular lattice is along a second line 53. For example, the second line 53 is orthogonal to the first line 51. The first line 51 and the second line 53 pass through a center of gravity of one of the plurality of structures 63 in the plane including the first line 51 and the second line 53. As shown in FIG. 6, the planar shape of one of the plurality of structures 63 is asymmetrical with respect to the first line 51, for example. The planar shape of one of the plurality of structures 63 is asymmetrical with respect to the second line 53.

By the photonic crystal layer 31 including such a structure, infrared rays 80 are emitted in a direction generally perpendicular to the active layer 20. For example, an angle between the emission direction of the infrared rays 80 and the face of the active layer 20 may be, for example, not less than 81 degrees and not more than 99 degrees. This angle can be arbitrarily changed depending on the design. The infrared rays 80 may be emitted along a direction according to the design. The current injection region 72 may be perpendicular to one of the first line 51 and the second line 53 of the rectangular lattice in the photonic crystal layer 31, for example.

In the examples of FIGS. 5 and 6, one of the plurality of structures 63 is a right triangular prism (the planar shape is a right triangle). In the embodiment, the planar shape of one of the plurality of structures 63 may be any shape that is asymmetrical with respect to the first line 51 and the second line 53.

For example, the first semiconductor layer 30 and the second semiconductor layer 39 may each include an n-type layer. In this case, the carriers that cause intersubband transitions are electrons. The thickness of the first semiconductor layer 30 is, for example, not less than 1 μm and not more than 10 μm. The thickness of the second semiconductor layer 39 may be, for example, not less than 1 μm and not more than 10 μm.

The voltage applied to the first electrode 50 and the second electrode 52 causes carriers to pass through the quantum well layer, and thereby, causing the intersubband transition. As a result, single mode laser emission is generated. The wavelength of the laser emission is, for example, not less than 2.5 μm and not more than 10.0 μm. This laser emission becomes infrared rays 80. The lattice spacing P1 (see FIG. 6) between the plurality of structures 63 may be, for example, not less than 0.5 times and not more than 2 times a wavelength in the medium of the infrared rays 80. The wavelength in the medium corresponds to the wavelength of laser emission from the active layer 20 within the photonic crystal layer 31 (medium).

Figures 7A, 7B:
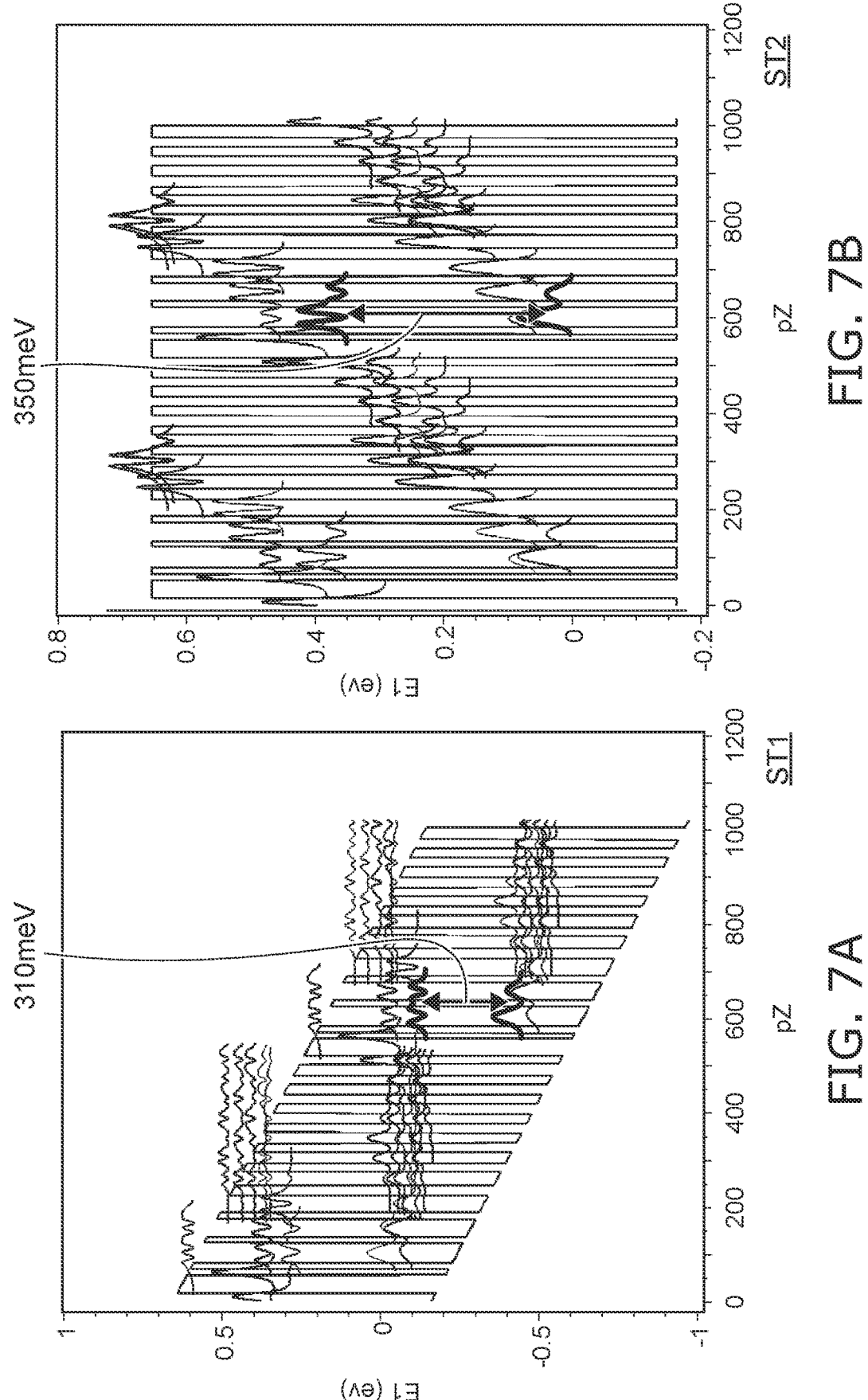
FIGS. 7A and 7B are schematic diagrams illustrating the characteristics of the sensing system.

FIGS. 7A and 7B are schematic diagrams illustrating the characteristics of the sensing system.

FIG. 7A shows an example of the energy band in a current injection state ST1 in the optical device 110 (planar quantum cascade device). FIG. 7B shows an example of the energy band in a zero bias state ST2. The horizontal axis of these figures is a position pZ (angstrom) in the thickness direction. The vertical axis is energy E1 (eV).

As shown in FIGS. 7A and 7B, the optical device 110 (planar quantum cascade element) emits light by intersubband transition of electrons. In the intersubband transitions, the oscillation wavelength does not depend on the semiconductor's inherent bandgap energy. At the emission wavelength, light absorption is low. By design, a structure can be obtained that optimizes the level of intersubband transition and optimizes absorption. It is possible to control the amount of absorption according to the applied bias voltage.

The optical device 110 (planar quantum cascade device) operates at high speed because it uses the intersubband transition. The optical device 110 (planar quantum cascade device) is characterized by extremely peaky sensitivity due to the transitions between subbands. In the optical device 110 (planar quantum cascade element), it is difficult to detect incident light from the plane direction due to the transition selection rule. By combining with the photonic crystal layer 31, the detection direction in the optical device 110 can be changed to the desired direction.

In the optical device 110, for example, operation limited to the emission wavelength and detection wavelength is possible. In the optical device 110, the direction in which light is emitted and the direction in which light is received can be controlled. Thereby, background infrared rays that become noise can be reduced.

In one example of the embodiment, the light source and detector are planar. In the embodiments, the light source and detector may be end-faced. In this case, performance may be lower and the optical system may be more complex.

In the optical device 110 (planar quantum cascade element), high response speed can be easily obtained due to the intersubband transition. The applied voltage is controlled by pulse driving. Thereby, the optical device 110 (planar quantum cascade element) can be used as a light source or a photodetector.

In the embodiment, the optical device 110 (planar quantum cascade element) functions as a light source when the voltage applied from the power supply 160 is the first voltage (ON voltage). When the voltage applied from the power supply 160 is the second voltage (OFF voltage or designed voltage), the optical device 110 (planar quantum cascade element) functions as a photodetector. The voltage applied from the power supply 160 may be controlled based on the operator's operation of the operation portion 140, as described above.

Next, an example of the reflective optical element 200 will be described.

The reflective optical element 200 includes the plurality of optical structures TP. Each of the plurality of optical structures TP includes an inclined reflective face. In one example, the optical structures TP may be triangular pyramids. The plurality of optical structures TP are provided, for example, on the substrate 200*a* (see FIG. 8). The plurality of optical structures TP are two-dimensionally arranged along the substrate 200*a*. The reflective optical element 200 includes an array of the plurality of optical structures TP. Metal may be deposited on the plurality of optical structures TP (triangular pyramids) to provide a metal member 220 (see FIG. 12). The plurality of optical structures TP (triangular pyramids) are arranged in a triangular lattice shape.

In this way, one of the plurality of optical structures may be a triangular pyramid. The reflective optical element 200 may further include the metal member 220 (see FIG. 12). The metal member 220 is in contact with the plurality of optical structures TP (see FIG. 12). The plurality of optical structures TP include, for example, at least one selected from the group consisting of Si, CaF, Ge, and zinc sulfide. The metal member 220 includes, for example, at least one selected from the group consisting of gold, aluminum, copper, and nickel.

Hereinafter, an example of a method for manufacturing the reflective optical element 200 will be described.

A substrate 200*a* is prepared. The substrate 200*a* may be, for example, a silicon (Si) substrate, a calcium fluoride (CaF$_2$) substrate, a germanium (Ge) substrate, or a zinc sulfide (ZnS) substrate. The substrate 200*a* may be, for example, a substrate that can transmit infrared rays. The shape of the substrate 200*a* when viewed from above may be, for example, approximately circular.

The substrate 200*a* is processed as follows.

Figure 8:
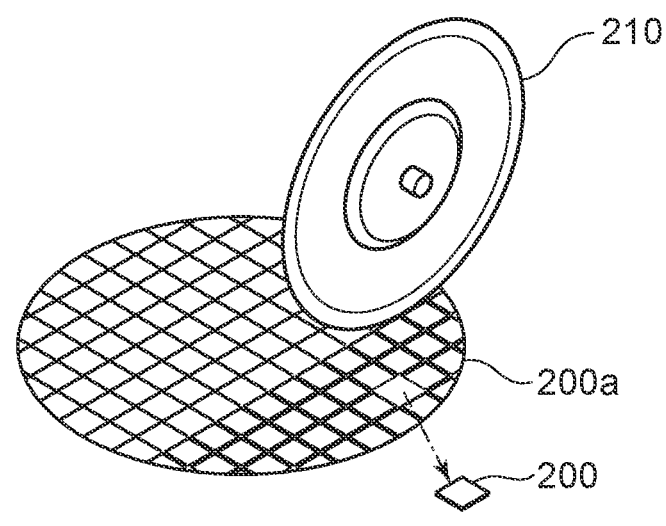
FIG. 8 is a schematic perspective view illustrating a method of manufacturing a part of the sensing system according to the embodiment.

FIG. 8 is a schematic perspective view illustrating a method of manufacturing a part of the sensing system according to the embodiment.

FIG. 8 illustrates the state of the substrate 200*a* in the processing.

As shown in FIG. 8, a blade 210 being circular is positioned above the substrate 200*a* being circular so as to be perpendicular to the substrate 200*a*. As the blade 210 rotates and moves over the substrate 200*a*, a groove is formed on the substrate 200*a*. In this example, the side surface of the groove becomes a face of the reflective optical element 200 (an array of a plurality of optical structures TP), as will be described later.

For example, dicing may be performed. As will be described later, after the array of the plurality of optical structures TP is formed on the substrate 200*a* and a metal film is formed (e.g., evaporated), the substrate 200*a* is divided into desired sizes, for example. In FIG. 8, the plurality of reflective optical elements 200 being rectangular are formed. By controlling the position of dicing on the substrate 200*a*, the reflective optical element 200 with a desired size can be obtained.

Figure 9:
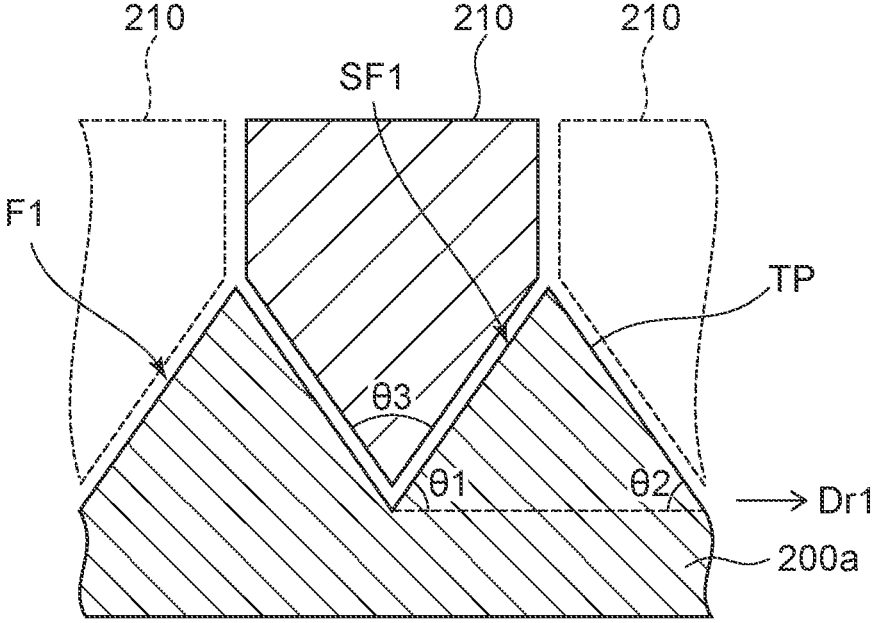
FIG. 9 is a schematic cross-sectional view illustrating a method of manufacturing a part of the sensing system according to the embodiment.

FIG. 9 is a schematic cross-sectional view illustrating a method of manufacturing a part of the sensing system according to the embodiment.

FIG. 9 shows an example of a tip of the blade 210.

In the embodiment, an angle θ3 of the tip of the blade 210 is about 70 degrees. The blade 210 forms the groove on the surface of the substrate 200*a*. By moving the position of the blade 210 parallel to the substrate 200*a*, a recess portion having a triangular cross section is formed on the substrate 200*a*. In this example, a triangular pyramid-shaped recess is formed by changing the advancing direction of the blade 210 within the plane. The triangular pyramid is, for example, a regular triangular pyramid. An angle θ1 of one of the plurality of slopes of the equilateral triangular pyramid is about 55 degrees. Another angle θ2 of the plurality of slopes is about 55 degrees. Each of the angle θ1 and the angle θ2 is, for example, 55.73561 degrees. It is desirable that the angle θ1 and the angle θ2 are 55 degrees ±1 degrees. For example, angle θ2 is substantially the same as angle θ1. Hereinafter, the angle θ1 and the angle θ2 will be referred to as an angle θ.

The grooves form triangular pyramids that become a plurality of optical structures TP. A length of one of the triangular pyramids is defined as a first length r (see FIG. 11). The angle θ is, for example, 0.5×arccos(⅓). A depth of the groove is expressed as r/[2 sqrt(3)tan(θ)]. Therefore, the depth of the groove is substantially 0.408r. A pitch of the grooves (interval L, see FIG. 10) is substantially r×sqrt(3)× (½). The pitch (interval L) of the grooves is approximately 0.866025r.

For example, each of the plurality of optical structures TP is a triangular pyramid. The triangular pyramid can be an equilateral triangular pyramid. One side of the base of the triangular pyramid has the first length r. The height of the triangular pyramid corresponds to the depth of the groove described above. The height of the triangular pyramid is 0.408 times the first length r. Practically, The height of the triangular pyramid may be not less than 0.405 times and not more than 0.411 times the first length r. The base of the triangular pyramid includes an apex that faces the side. A distance between the apex and the side along a direction perpendicular to the side corresponds to the interval L of the grooves (pitch). Practically, the distance between the apex and the side (interval L of the grooves) may be not less than 0.865 times and not more than 0.867 times the first length r.

Thus, one of the plurality of optical structures TP includes the inclined face SF1 (see FIG. 9). The angle (angle θ1 or angle θ2) between the inclined face SF1 and the first direction Dr1 may be 55.7 degrees ±0.1 degrees. The first direction Dr1 is along the first plane F1.

Figures 10, 11:
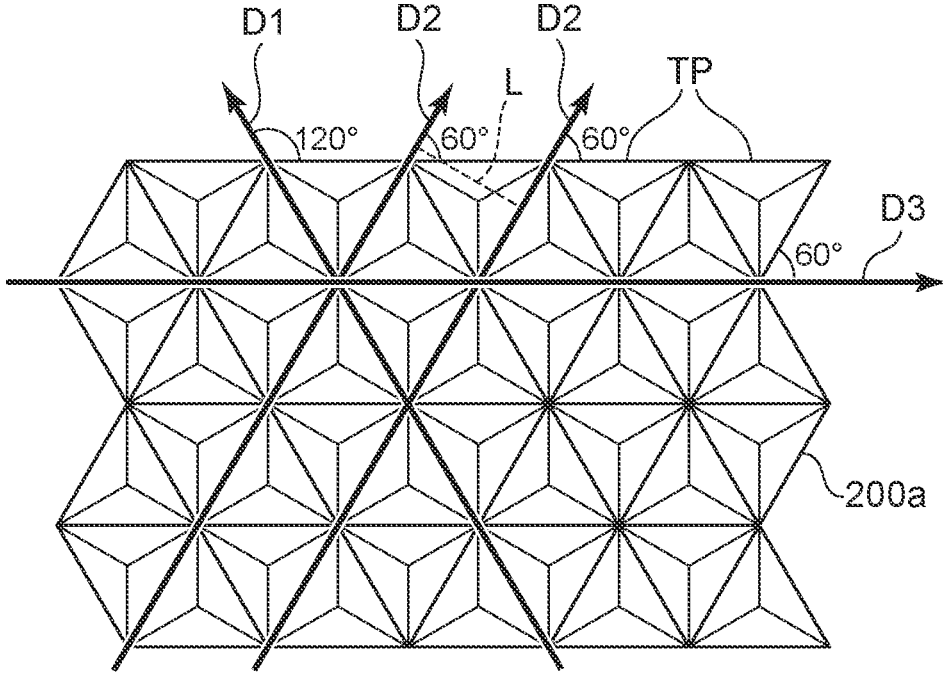
FIG. 10 is a schematic plan views illustrating a part of the sensing system according to the embodiment.
FIG. 11 is a schematic plan views illustrating a part of the sensing system according to the embodiment.

FIGS. 10 and 11 are schematic plan views illustrating a part of the sensing system according to the embodiment.

FIG. 10 illustrates the directions in which the groove are formed by the blade 210. As shown in FIG. 10, grooves are formed at intervals L along each of the first axial direction D1, the second axial direction D2, and the third axial direction D3. Three surfaces of the groove are triangular. The angle between the three directions is 60 degrees. The angle between the first axial direction D1 and the second axial direction D2 is 60 degrees. The angle between the second axial direction D2 and the third axial direction D3 is 60 degrees. The angle between the third axial direction D3 and the first axial direction D1 is 60 degrees. The plurality of optical structures TP (triangular pyramids) are formed by the grooves.

As shown in FIG. 11, a length of a plurality of sides included in one of the plurality of optical structures TP (triangular pyramids) is the first length r. By appropriately setting the interval L, the sides of the plurality of optical structures TP (triangular pyramids) have the first length r. The interval L corresponds to the length between one side and the opposite apex of one triangular pyramid of the plurality of optical structures TP. The interval L corresponds, for example, to the height of a triangle in a plane. The grooves formed by the blade 210 form an array of optical structures TP (triangular pyramids) on the substrate 200a.

FIG. 11 illustrates the planar shape of one of the plurality of optical structures TP (triangular pyramids). One of the plurality of optical structures TP (triangular pyramids) is an equilateral triangular pyramid. The first length r of one side of the equilateral triangular pyramid is, for example, 1 mm or less. The first length r is shorter than a length (size) in one direction of the infrared ray beam emitted from the optical device 110 (planar quantum cascade element). The length of the infrared ray beam in one direction may be, for example, the length of the photonic crystal layer 31 included in the optical device 110 in the one direction. For example, the size of one of the optical structures TP may be smaller than the size of the optical device 110.

Figure 12:
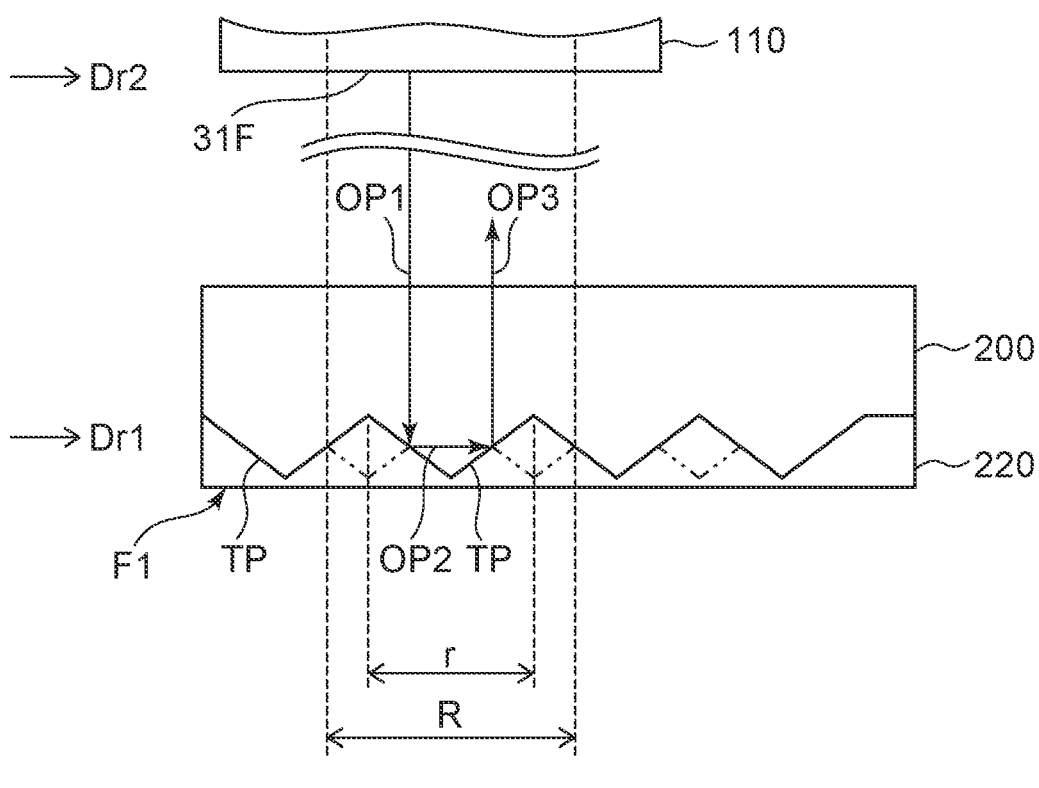
FIG. 12 is a schematic diagram illustrating the operation of the sensing system according to the embodiment.

For example, the metal member 220 (metal film) is formed on the surfaces of the plurality of optical structures (triangular pyramids) formed on the substrate 200a (see FIG. 12). The metal member 220 may be formed by vapor deposition. The metal includes, for example, at least one selected from the group consisting of gold, aluminum, copper, and nickel. A material that can reflect infrared rays can be used as the metal. The metal may be formed in the form of a film on at least the surface of the triangular pyramid. The metal member 220 may be formed such that the triangular pyramid is embedded therein. A high reflectance can be obtained by the metal member 220. The metal member 220 may be omitted. Reflection may be obtained due to a difference in refractive index between the substrate 200a and the space around it. An example in which the triangular pyramids are buried in the metal member 220 will be described below.

FIG. 12 is a schematic diagram illustrating the operation of the sensing system according to the embodiment.

FIG. 12 shows an example of the optical path of infrared rays in the reflective optical element 200.

As shown in FIG. 12, in the reflective optical element 200, the plurality of optical structures TP (triangular pyramids) are aligned. The plurality of optical structures TP (triangular pyramids) are embedded in the metal member 220 (for example, a metal layer). The reflective optical element 200 is provided between the metal member 220 and the optical device 110 (planar quantum cascade element). The optical device 110 (planar quantum cascade element) is provided on the opposite side of the surface of the reflective optical element 200 on which the triangular pyramid is provided. The size (first length r of one side) of one of the plurality of optical structures TP (triangular pyramid) is smaller than a second length R (size) of the optical device 110 (planar quantum cascade element). The second length R (size) may be, for example, the size of the photonic crystal layer 31 included in the optical device 110.

For example, the first length r of one of the plurality of optical structures TP is shorter than the second length R of the element face 31F. The first length r is the length of one of the plurality of optical structures TP along the first direction Dr1 along the first plane F1. The second length R is the length of the element face 31F along a second direction Dr2 along the element face 31F. In one example, the second length R may be not less than 2 times and not more than 100 times the first length r.

As shown in FIG. 12, infrared rays 80 from the optical device 110 (planar quantum cascade element) enter the reflective optical element 200. An optical path OP1 of incident is perpendicular to the reflective optical element 200. The infrared rays 80 on the optical path OP1 are reflected by one side of the triangular pyramid. The optical path of the infrared rays 80 is changed from the optical path OP1 to an optical path OP2. The infrared rays 80 on the optical path OP2 are reflected by the other side of the triangular pyramid. The optical path OP2 of the infrared rays 80 is changed to an optical path OP3. The optical path OP3 is parallel to the optical path OP1. The orientation of the optical path OP3 is opposite to the orientation of optical path OP1. A shift occurs between the optical path OP3 and the optical path OP1 due to reflection at the triangular pyramid. This shift is smaller than the size of the triangular pyramid (first length r). The shift is smaller than the size of the optical device 110 (planar quantum cascade element). The infrared rays 80 emitted from the optical device 110 enter the optical device 110. The optical device 110 can function as a light source and a photodetector. Such an effect can also be obtained when the infrared rays 80 are obliquely incident on the reflective optical element 200.

Figure 13:
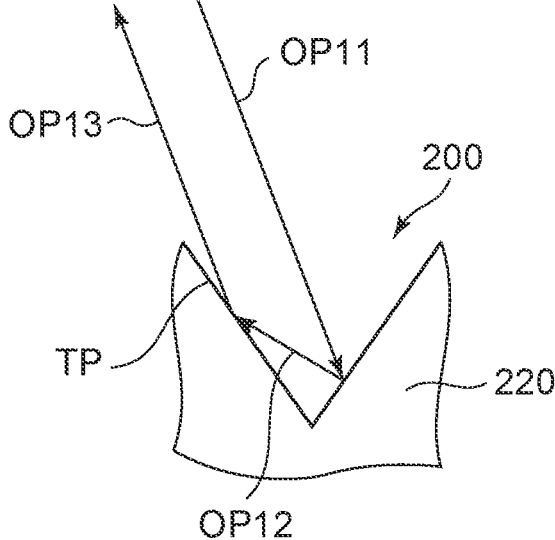
FIG. 13 is a schematic diagram illustrating the operation of the sensing system according to the embodiment.

FIG. 13 is a schematic diagram illustrating the operation of the sensing system according to the embodiment.

FIG. 13 shows an example of an optical path when infrared rays 80 are obliquely incident on the reflective optical element 200.

As shown in FIG. 13, infrared rays 80 obliquely enter the reflective optical element 200 along an optical path OP11. The infrared rays 80 are reflected by one side of the triangular pyramid. The optical path of the infrared rays 80 is changed from the optical path OP11 to an optical path OP12. Furthermore, the infrared rays 80 are reflected from the other side of the triangular pyramid. The optical path of the infrared rays 80 is changed from the optical path OP12 to an optical path OP13. The optical path OP13 is substantially parallel to the optical path OP11. The orientation of optical path OP13 is opposite to the orientation of the optical path OP11. The shift between the optical path OP13 and the optical path OP11 is smaller than the size of the triangular pyramid. Even when the infrared rays 80 are obliquely incident on the reflective optical element 200, for example, the infrared rays 80 emitted from the optical device 110 are incident on the optical device 110. The optical device 110 can function as a light source and a photodetector.

Next, an example of a gas safety inspection in which the detection target 400 (gas) is detected using the sensing system 1 described above will be described.

Figure 14:
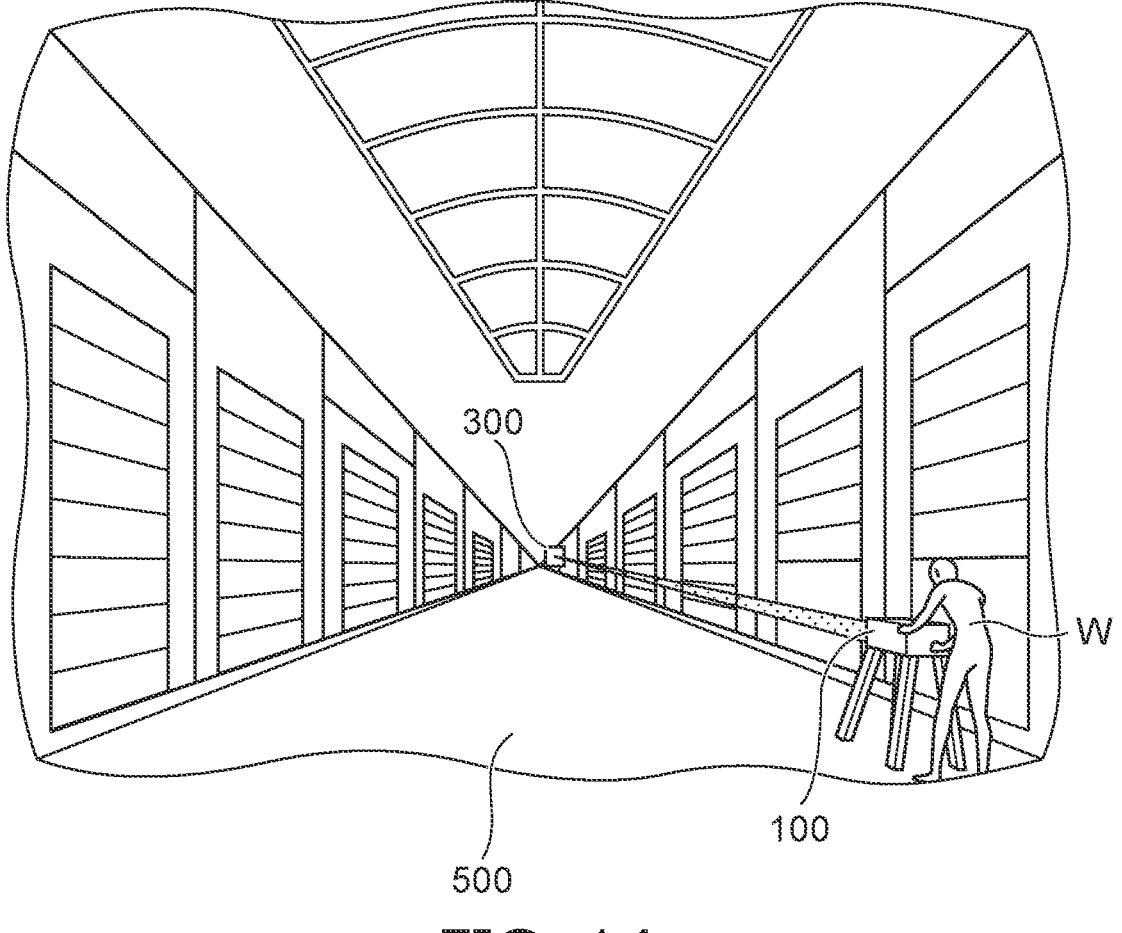
FIG. 14 is a schematic diagram illustrating an application of the sensing system according to the embodiment.

FIG. 14 is a schematic diagram illustrating an application of the sensing system according to the embodiment.

FIG. 14 is a diagram showing an example of a gas safety inspection. The sensing system 1 according to the embodiment includes the detection device 100 and the reflector 300. FIG. 14 illustrates an example of a gas safety inspection in a shopping district.

The detection device 100 is provided on the near side of a road 500. The detection device 100 is fixed at a predetermined height from the road 500 using, for example, a tripod. The detection device 100 faces toward the back of the road 500. The infrared rays 80 emitted from the optical device 110 included in the detection device 100 are irradiated toward the back of the road 500. The worker W can change the orientation of the detection device 100.

The reflector 300 is provided on the back side of the road 500. The distance between the detection device 100 and the reflector 300 is, for example, about 10 m. The reflective optical element 200 included in the reflector 300 faces the detection device 100. The reflector 300 may be provided on a moving body or the like. The moving body includes a drone or a car. The worker W may hold the reflector 300. The reflector 300 may move autonomously. Efficient inspection becomes possible.

The worker W who operates the detection device 100 operates the operation portion 140 to cause the aiming LD 130 to emit light. The laser beam 130L from the aiming LD 130 is irradiated to the back side of the road 500. The worker W may adjust the emission direction (irradiation direction) so that the laser beam 130L is irradiated onto the reflective optical element 200 of the reflector 300. For example, after completing the adjustment of the irradiation destination of the laser beam 130L, the worker W operates the operation portion 140 to stop the aiming LD 130 from emitting light.

The worker W adjusts the voltage applied to the optical device 110 (planar quantum cascade element).

When an ON voltage is applied to the optical device 110 (planar quantum cascade element), the optical device 110 (plane quantum cascade element) functions as a light source. Infrared rays 80 emitted from the optical device 110 (planar quantum cascade element) enter the reflective optical element 200 of the reflector 300. The infrared rays 80 reflected by the reflective optical element 200 are incident on the optical device 110 (planar quantum cascade element). In infrared rays 80, the shift between the illuminating optical path and the incident optical path is small. The shift is, for example, smaller than the second length R (size of the photonic crystal layer 31) of the optical device 110 (planar quantum cascade element). The infrared rays 80 being reflected are reliably incident on the photonic crystal layer 31.

When no voltage is applied to the optical device 110 (planar quantum cascade element) (off voltage, etc.), the optical device 110 (plane quantum cascade element) functions as a photodetector. The intensity of the infrared rays 80 incident on the photonic crystal layer 31 can be detected. The intensity of the infrared rays 80 being detected is displayed on the display 150. Based on the intensity of the infrared rays 80 displayed on the display 150, the worker W recognized whether or not the detection target 400 (gas) exists between the detection device 100 and the reflector 300, or the concentration. For example, if the displayed intensity of the infrared rays 80 is below a predetermined value, it is determined that the detection target 400 (gas) exists. For example, if the intensity exceeds a predetermined value, it is determined that the detection target 400 (gas) does not exist.

In the sensing system 1, the size of the plurality of optical structures TP (triangular pyramids) included in the reflector 300 is smaller than the size of the photonic crystal layer 31 included in the optical device 110. The shift between the irradiation optical path of the infrared rays 80 emitted from the detection device 100 and the incident optical path of the infrared rays 80 reflected by the reflector 300 can be reduced. The infrared rays 80 being incident can be reliably detected.

In the sensing system 1, the size of the reflector 300 including the reflective optical element 200 can be reduced. A compact system is obtained. For example, a reference example using a retroreflector assembled with plane mirrors can be considered. In this reference example, there is a limit to miniaturization. For example, a reference example may be considered in which a reflective surface that reflects infrared rays is manufactured using machining or a mold. In this case, the degree of difficulty in microfabrication of the mating portion of the reflective surfaces (for example, three surfaces) increases. In this reference example, as the size of the reflective surface becomes smaller, the size of the mating portion of the reflective surface cannot be ignored. In the manufacturing method according to the embodiment, the above problems can be suppressed.

The sensing system 1 can be applied not only to gas safety inspections but also to other gas measurements.

For example, the detection device 100 may be mounted on a vehicle. A plurality of reflectors 300 may be provided at a plurality of locations near the road. The worker W may sequentially detect gas between the plurality of reflectors 300 and the detection device 100 while moving the vehicle. Such an inspection allows gas safety inspections to be carried out at high speed.

In the embodiment, the size of the reflector 300 (reflective optical element 200) is small. The degree of freedom regarding the position where the reflector 300 is provided is expanded. For example, the reflector 300 can be easily installed near a gas pipe installed at a high place in a space such as a room. The reflector 300 (reflective optical element 200) may be installed at all times, including times other than during detection. For example, during regular inspections, the reflector 300 (reflective optical element 200) that is always installed is used. A gas safety inspections at high places can be performed simply by operation the detection device 100. The effort of installing the reflector 300 (reflective optical element 200) for each gas safety inspection can be omitted.

In the embodiment, the optical device 110 (for example, a planar quantum cascade element) included in the detection device 100 has a function as a light source and a photodetector. The optical device 110 may include a device for a light source and a device for a photodetector.

Second Embodiment

The second embodiment relates to the reflective optical element 200 described above. The reflective optical element 200 is used in the sensing system 1. The reflective optical element 200 includes the plurality of optical structures TP. One of the plurality of optical structures TP is a triangular pyramid. The plurality of optical structures TP are arranged in a triangular lattice shape.

The embodiments may include the following aspects.
(Additional Note 1)
A sensing system, comprising:
a light source including a light source element configured to emit infrared ray; and
a photodetector including a detection element configured to detects the infrared ray; and
a reflective optical element of array, the array being configured with a size smaller than each of the light source element and the detection element.
The sensing system according to Additional note 1, wherein
in the reflective optical element, the array is formed by an array of triangular pyramids formed on a substrate,
a metal is deposited on the triangular pyramids, and
the triangular pyramids are arranged in a triangular lattice shape.
The sensing system according to Additional note 2, wherein
the substrate is any one of a Si substrate, a CaF substrate, a Ge substrate, or a zinc sulfide substrate, and
the metal is any one of gold, aluminum, copper, or nickel.
The sensing system according to Additional note 2 or 3, wherein
an angle of a groove slopes separated between the triangular pyramids is 55.7 degrees ±0.1 degrees.
The sensing system according to Additional note 2 or 3, wherein
a length of one side of the triangular pyramid is r,
a depth of the groove is $r/[2 \sqrt{3}\tan \theta]$, with $\theta = 0.5 \times$ arccos (⅓), and
a pitch of the groove is $r \times \mathrm{sqrt}(3) \times (½)$.
The sensing system according to any one of Additional note 1-5, wherein
the light source element included in the light source and the detection element included in the photodetector are included in a planar quantum cascade element, the planar quantum cascade element is used as the light source or as the photodetector depending on ON/OFF of a voltage application or applied voltage value.

A reflective optical element being used in a sensing system having a light source including a light source element configured to emit light in the mid-infrared region and a photodetector including a detection element, the reflective optical element comprising:
an array configured with a size smaller than each of the light source element and the detection element.

According to the embodiment, a compact sensing system and a reflective optical element can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensing systems and reflective optical elements such optical devices, reflective optical elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensing systems and all reflective optical elements practicable by an appropriate design modification by one skilled in the art based on the sensing systems and the reflective optical elements described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensing system, comprising:
a reflective optical element including a plurality of optical structures arranged along a first plane; and
an optical device including an element face, the optical device being configured to perform a first operation and a second operation, the optical device being configured to emit infrared rays from the element face in the first operation, and the optical device being configured to detect the infrared rays reflected by the reflective optical element and incident on the element face in the second operation, wherein:
a first length of one of the plurality of optical structures is shorter than a second length of the element face,

the first length is a length of the one of the plurality of optical structures along a first direction along the first plane, and the second length is a length of the element face along a second direction along the element face.

2. The sensing system according to claim 1, wherein the second length is not less than 2 times and not more than 100 times the first length.

3. The sensing system according to claim 1, wherein a first time period of the first operation is shorter than a time period of the infrared rays travel through twice a distance between the reflective optical element and the optical device.

4. The sensing system according to claim 3, wherein the first time period is not less than 10 ns and not more than 500 ns.

5. The sensing system according to claim 4, wherein the second operation is performed after the first operation and is continuous with the first operation.

6. The sensing system according to claim 5, wherein a second time period of the second operation is longer than the first time period.

7. The sensing system according to claim 5, wherein the optical device is configured to repeatedly perform a set including the first operation and the second operation.

8. The sensing system according to claim 1, wherein the infrared rays reflected by the reflective optical element and incident on the element face have a first intensity in a first state, the infrared rays reflected by the reflective optical element and incident on the element face have a second intensity in the second state, a first concentration of a detection target existing in a space between the optical device and the reflective optical element in the first state is higher than a second concentration of the detection target in the second state, and the first intensity is lower than the second intensity.

9. The sensing system according to claim 8, wherein the detection target includes hydrocarbons.

10. The sensing system according to claim 8, wherein the detection target includes methane.

11. The sensing system according to claim 8, wherein the one of the plurality of optical structures includes a inclined face, and an angle between the inclined face and the first direction is 55.7 degrees±0.1 degrees.

12. The sensing system according to claim 1, wherein the one of the plurality of optical structures is a triangular pyramid, and the plurality of optical structures are arranged in a triangular lattice shape.

13. The sensing system according to claim 12 wherein the reflective optical element further includes a metal member, and the metal member is in contact with the plurality of optical structures.

14. The sensing system according to claim 13 wherein the plurality of optical structures include at least one selected from the group consisting of Si, CaF, Ge, and zinc sulfide, and the metal member includes at least one selected from the group consisting of gold, aluminum, copper, and nickel.

15. The sensing system according to claim 1, wherein each of the plurality of optical structures is a triangular pyramid, a side of a base face of the triangular pyramid has a first length, a height of the triangular pyramid is not less than 0.405 times and not more than 0.411 times the first length, the base face includes an apex opposite to the side, and a distance between the apex and the side along a direction perpendicular to the side is not less than 0.865 times and not more than 0.867 times the first length.

16. The sensing system according to claim 1, wherein the optical device includes a planar quantum cascade element.

17. The sensing system according to claim 16, wherein the planar quantum cascade element includes an active layer configured to emit the infrared rays, and a photonic crystal layer overlapping the active layer, and the element face corresponds to the photonic crystal layer.

18. A reflective optical element, the reflective optical element being used in the sensing system according to claim 1, the reflective optical element comprising:

the plurality of optical structures.

19. The reflective optical element according to claim 18, wherein one of the plurality of optical structures is a triangular pyramid, and the plurality of optical structures are arranged in a triangular lattice shape.

* * * * *